United States Patent
Janesch et al.

(10) Patent No.: US 7,336,134 B1
(45) Date of Patent: Feb. 26, 2008

(54) DIGITALLY CONTROLLED OSCILLATOR

(75) Inventors: Stephen T. Janesch, Greensboro, NC (US); Paul G. Martyniuk, Somerville, MA (US)

(73) Assignee: RF Micro Devices, Inc., Greensboro, NC (US)

( * ) Notice: Subject to any disclaimer, the term of this patent is extended or adjusted under 35 U.S.C. 154(b) by 53 days.

(21) Appl. No.: 10/877,295

(22) Filed: Jun. 25, 2004

(51) Int. Cl.
*H03B 5/12* (2006.01)
*H03I 7/099* (2006.01)

(52) U.S. Cl. ............... 331/36 C; 331/117 R; 331/57; 331/177 V; 331/185

(58) Field of Classification Search ........... 331/117 R, 331/117 FE, 57, 36 C, 177 V, 185
See application file for complete search history.

(56) References Cited

U.S. PATENT DOCUMENTS

| | | | | |
|---|---|---|---|---|
| 5,739,725 A * | 4/1998 | Ferraiolo et al. | .............. | 331/57 |
| 6,317,006 B1 * | 11/2001 | Welland et al. | ................ | 331/25 |
| 6,396,358 B1 * | 5/2002 | Poss et al. | ..................... | 331/57 |
| 6,560,452 B1 | 5/2003 | Shealy | ....................... | 455/333 |
| 6,658,748 B1 | 12/2003 | Leipold et al. | ............... | 33/179 |
| 6,690,241 B2 * | 2/2004 | Ooishi et al. | .................. | 331/57 |
| 6,710,664 B2 | 3/2004 | Humphreys et al. | .......... | 331/11 |
| 6,724,265 B2 | 4/2004 | Humphreys | .................... | 331/17 |
| 6,724,267 B2 * | 4/2004 | Kim | ............................ | 331/57 |
| 6,731,145 B1 | 5/2004 | Humphreys et al. | ........ | 327/156 |
| 6,791,425 B2 * | 9/2004 | Kitamura | ................ | 331/117 R |
| 6,825,732 B2 * | 11/2004 | Motoyama | .................... | 331/57 |
| 6,853,257 B2 * | 2/2005 | Yonekawa et al. | ............ | 331/17 |
| 6,856,206 B1 * | 2/2005 | Perrott | ........................ | 331/25 |
| 6,876,266 B2 * | 4/2005 | Koo et al. | ............... | 331/117 R |
| 6,906,596 B2 * | 6/2005 | Kitamura et al. | ......... | 331/36 C |
| 6,909,336 B1 * | 6/2005 | Rajagopalan et al. | ....... | 331/183 |
| 2002/0041196 A1 * | 4/2002 | Demone et al. | ............ | 327/158 |
| 2002/0175717 A1 * | 11/2002 | Ray | ........................... | 327/108 |
| 2003/0141936 A1 * | 7/2003 | Staszewski et al. | ........... | 331/16 |

* cited by examiner

*Primary Examiner*—Robert Pascal
*Assistant Examiner*—James Goodley
(74) *Attorney, Agent, or Firm*—Winthrow & Terranova, PLLC

(57) ABSTRACT

A tunable oscillator suitable for use in a frequency synthesizer of a transceiver is controlled by varying one or more parameters associated with the oscillator. In particular, a digital control signal affects one or more of the capacitances of the oscillator, the bias voltage of the oscillator, the supply voltage, or the bias current of the oscillator. Changes to one or more of these parameters allows the frequency of the oscillator to be controlled as desired.

11 Claims, 9 Drawing Sheets

DIGITALLY CONTROLLED OSCILLATOR

FIELD OF THE INVENTION

The present invention relates to a variable frequency oscillator whose frequency is controlled by a digital signal.

BACKGROUND OF THE INVENTION

Wireless transmitters and receivers have become ubiquitous in modern society. While radios and televisions have been commonplace for many years, the explosion of cellular telephones and other mobile terminals has created an overwhelming demand for wireless transceivers. Most such transceivers have a need to switch between frequencies. For example, in a cellular system, the base station may assign the cellular telephone to a particular frequency channel and time slot on which to communicate. The frequency channel lies within the total range of frequencies available for communication within the applicable standard. At a later time, the base station may assign the cellular telephone to a second, different frequency on which to communicate.

To effectuate changing the frequency channel such as when a base station assigns a cellular telephone to a new channel, most such transceivers include a frequency synthesizer. The frequency synthesizer is used to create a carrier frequency that is mixed with the baseband signal so that the signal may be transmitted at the appropriate frequency. Likewise, the frequency synthesizer creates a signal, which, when mixed with a received signal, downconverts the received signal to baseband or an intermediate frequency where further processing may be performed. Frequency synthesizers rely on variable frequency oscillators to help create the desired frequencies.

Variable frequency oscillators have myriad other uses besides their use in a mobile terminal frequency synthesizer. Regardless of usage, most conventional variable frequency oscillators are integrated resonant inducto-capacitor based (LC) oscillators with analog varactors. A varactor is a capacitor whose capacitance changes in a controlled manner in response to a control signal, typically an analog voltage. The varactors are controlled to vary the capacitance of the LC oscillator, and thus control the frequency of oscillation. However, these analog varactors alone do not achieve the tuning ranges required for most transceiver systems. Some conventional oscillators supplement the analog varactors by using a bank of binary weighted capacitors to control coarse tuning. However, this supplemental bank of capacitors requires a state machine to run a coarse tuning algorithm. Further, as integrated circuit geometries and supply voltages shrink, especially in mobile terminal environments, the analog voltage over which the frequency synthesizer operates also shrinks, requiring complicated architectural changes.

In short, the miniaturization of integrated circuits and the gradual erosion of supply voltage levels necessitate alternate strategies for providing controllable oscillators for use in transceivers.

SUMMARY OF THE INVENTION

The present invention provides a digitally controllable oscillator that may be used in a variety of applications such as frequency synthesis. In particular, the present invention allows the output frequency of the oscillator to be controlled through the use of one or more digital words. Each digital word is received by components that control various parameters of the oscillator. By varying the parameters, the operation of the oscillator is affected and the desired frequency is produced.

In a first embodiment, the oscillator is an LC oscillator. This first embodiment has multiple aspects. In a first aspect, the parameter is the capacitance. The component comprises a bank of capacitors that may be switched in or out to vary the capacitance. The digital word controls switches which connect or disconnect capacitors from the circuit, and thereby helps create the desired frequency. In a second aspect, the parameter is still capacitance. The component is a bank of varactors which remain connected but are switched into high or low capacitance states to vary the capacitance. The digital word raises or lowers the capacitance, and thereby helps create the desired frequency. In a third aspect, the parameter is a bias current for the oscillator. The component is a digital to analog converter (DAC) that controls the bias current. The digital word raises or lowers the bias current, and thereby helps create the desired frequency.

In a second embodiment, the oscillator is a ring oscillator. Like the first embodiment, this second embodiment has multiple aspects corresponding to different parameters which may be controlled. In a first aspect, the parameter is the bias current. The component is a current DAC that controls the bias current provided to the inverters of the ring oscillator. The digital word raises or lowers the current, and thereby helps create the desired frequency. In a second aspect, the parameter is capacitance and the component comprises one or more banks of capacitors that may be connected or disconnected to vary the capacitance. The digital word controls the switches that connect and disconnect the individual capacitors from the circuit, and thereby helps create the desired frequency.

It should further be appreciated that a given oscillator may be controllable at multiple levels. That is, two or more digital words may be used to control an appropriate number of parameters associated with the oscillator. In this manner, the controllable oscillator may be controlled at coarse, medium, and fine tuning levels. Alternatively, the controllable oscillator may be controlled at only two tuning levels such as coarse and fine.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

Figure 1:
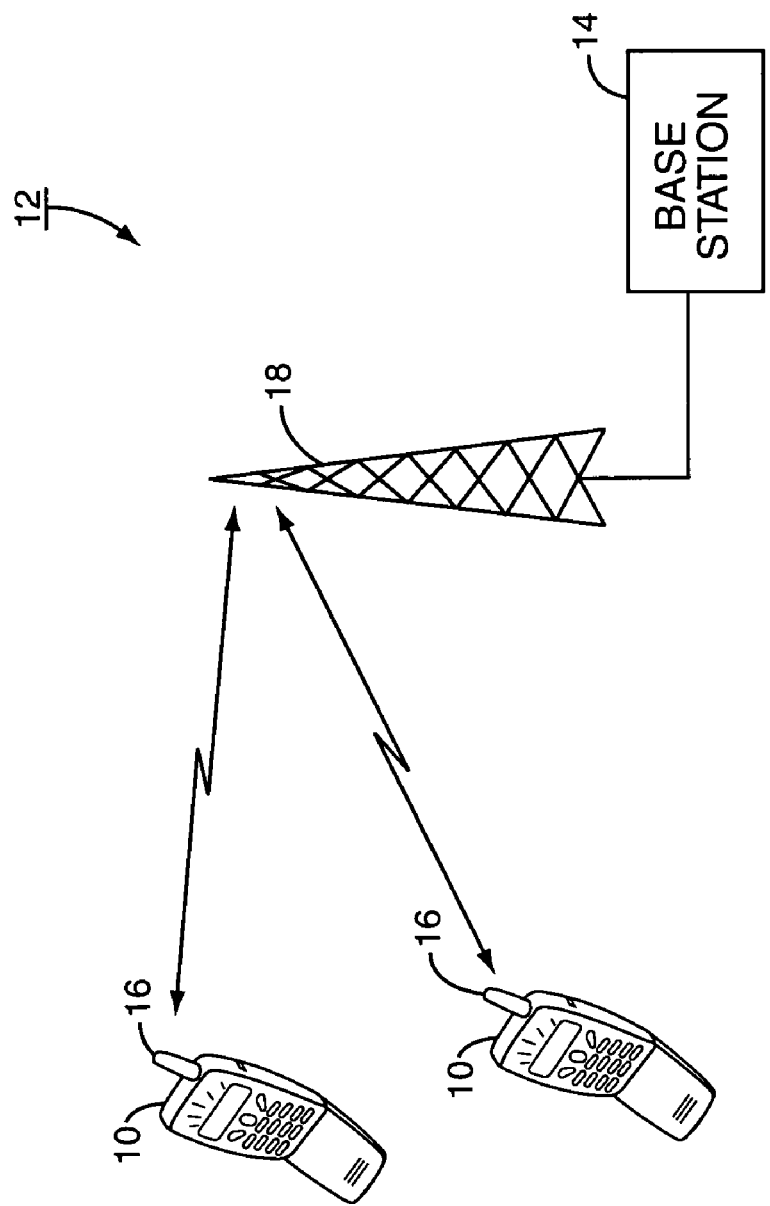
FIG. 1 illustrates a conventional mobile communications environment.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is directed to a digitally controlled oscillator such as may be used in a mobile terminal. The oscillator includes one or more elements which allow coarse and/or fining tuning of an output frequency of the oscillator. Each of the elements receives a corresponding digital word that in turn affects a parameter of the oscillator to control the output frequency. Particularly contemplated parameters include capacitance, bias current, supply voltage, and bias voltage. Control over such parameters gives control over the output frequency. Before turning to the present invention, a brief discussion of an exemplary environment in which the present invention could be used is provided relative to FIGS. 1 to 3. The discussion of the present invention begins with the discussion of FIG. 4.

The present invention is well suited for use in a mobile terminal such as a cellular telephone. However, the present invention is not restricted to such environments. Other wireless devices and wireless communications environments are possible, as well as wired environments. The present invention may also be used for purposes such as clock generation and clock recovery, and the use of the present invention in such environments is contemplated. However, for the purposes of illustrating the present invention, the following discussion will assume that a mobile terminal, such as mobile terminals 10 in FIG. 1, operate as cellular telephones in a global system for mobile communications (GSM) standard communication environment 12. Thus, mobile terminals 10 communicate with base station 14 through mobile terminal antennas 16 and base station antenna 18 as is well understood. From the base station 14, the mobile terminal is able to interface with the Public Land Mobile Network (PLMN, not illustrated) and the Public Switched Telephone Network (PSTN, not illustrated) as is well understood.

Figure 2:
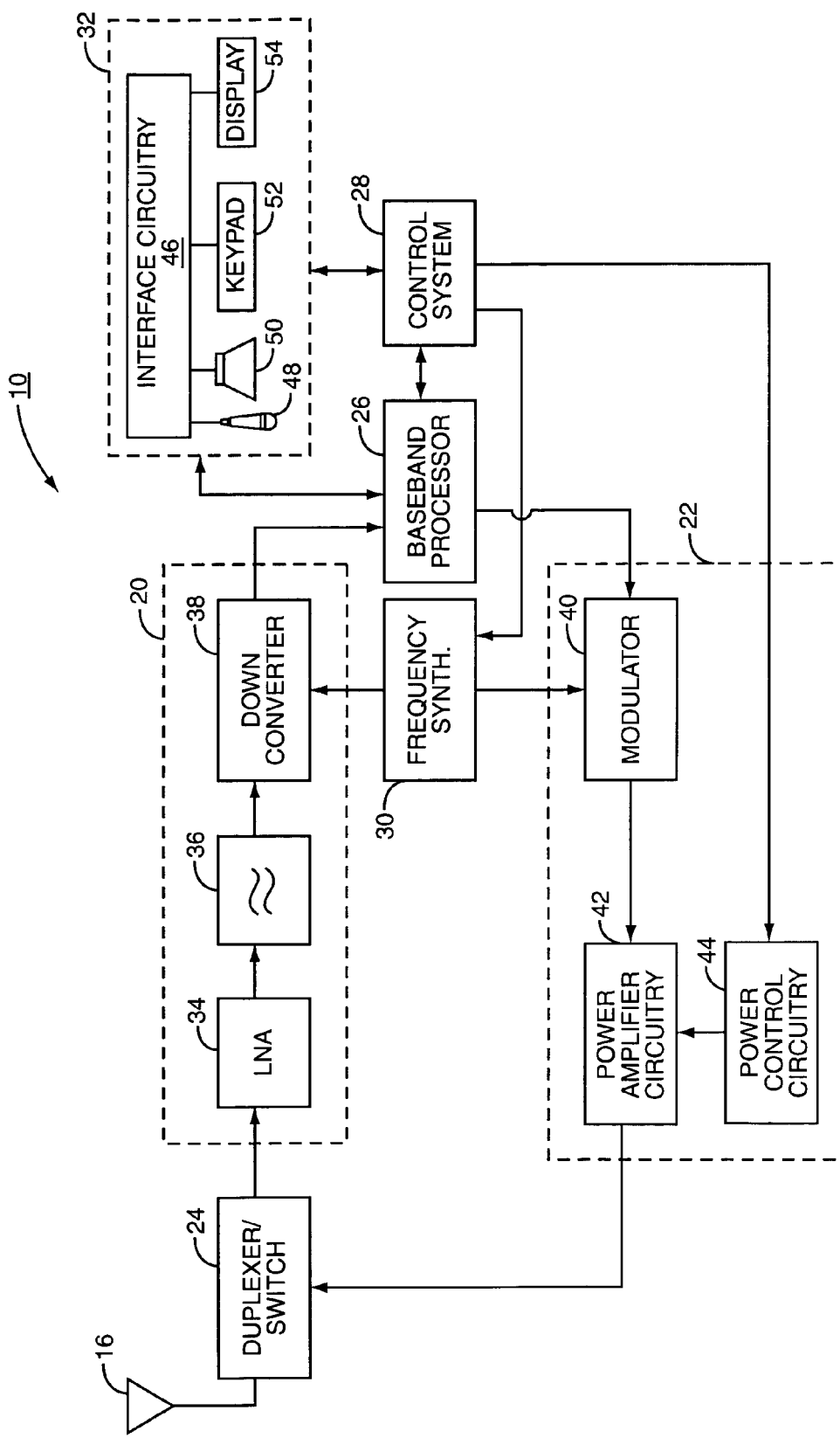
FIG. 2 illustrates a transceiver chain for a conventional mobile terminal.
Figure 3:
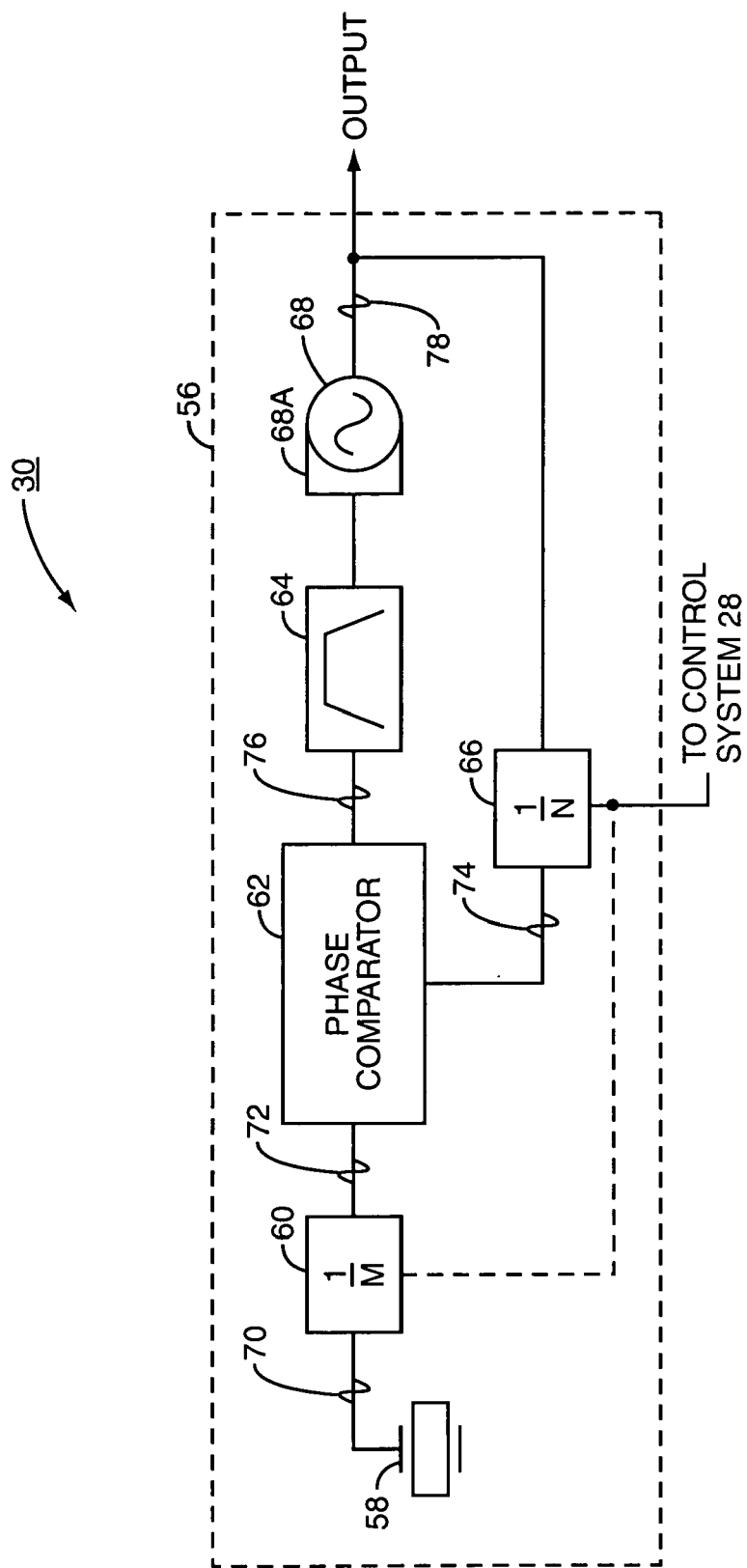
FIG. 3 illustrates a phase locked loop such as might be used in the mobile terminal of FIG. 2.

The basic architecture of a mobile terminal 10 is represented in FIG. 2 and may include a receiver front end 20, a radio frequency transmitter section 22, the aforementioned antenna 16, a duplexer or switch 24, a baseband processor 26, a control system 28, a frequency synthesizer 30, and an interface 32. The receiver front end 20 receives information bearing radio frequency signals from one or more remote transmitters provided by a base station 14 (FIG. 1). A low noise amplifier 34 amplifies the signal. A filter circuit 36 minimizes broadband interference in the received signal, while a downconverter 38 downconverts the filtered, received signal to an intermediate or baseband frequency signal, which is then digitized into one or more digital streams. The receiver front end 20, and specifically the downconverter 38, typically uses one or more mixing frequencies generated by the frequency synthesizer 30.

The baseband processor 26 processes the digitized received signal to extract the information or data bits conveyed in the received signal. This processing typically comprises demodulation, decoding, and error correction operations. As such, the baseband processor 26 is generally implemented in one or more digital signal processors (DSPs).

On the transmit side, the baseband processor 26 receives digitized data from the control system 28, which it encodes for transmission. The encoded data is output to the transmitter 22, where it is used by a modulator 40 to modulate a carrier signal that is at a desired transmit frequency. Power amplifier circuitry 42 amplifies the modulated carrier signal to a level appropriate for transmission from the antenna 16. The carrier signal may be provided by the frequency synthesizer 30.

The power amplifier circuitry 42 provides gain for the signal to be transmitted under control of the power control circuitry 44, which is preferably controlled by the control system 28.

A user may interact with the mobile terminal 10 via the interface 32, which may include interface circuitry 46 associated with a microphone 48, a speaker 50, a keypad 52, and a display 54. The interface circuitry 46 typically includes analog-to-digital converters, digital-to-analog converters, amplifiers, and the like. Additionally, it may include a voice encoder/decoder, in which case it may communicate directly with the baseband processor 26.

The microphone 48 will typically convert audio input, such as the user's voice, into an electrical signal, which is then digitized and passed directly or indirectly to the baseband processor 26. Audio information encoded in the received signal is recovered by the baseband processor 26, and converted into an analog signal suitable for driving speaker 50 by the I/O and interface circuitry 46. The keypad 52 and display 54 enable the user to interact with the mobile terminal 10, input numbers to be dialed, address book information, or the like, as well as monitor call progress information.

The present invention is well suited for use in an element such as the frequency synthesizer 30. A more detailed diagram of the frequency synthesizer 30 is provided in FIG. 3. Frequency synthesizer 30 is formed from a phase locked loop 56 and includes a crystal oscillator 58, a reference divider 60 (denoted in FIG. 3 as 1/M), a phase comparator 62, a filter 64, a feedback divider 66 (denoted in FIG. 3 as 1/N), and a controllable oscillator 68. The controllable oscillator 68 may have an optional state machine 68A.

In use, the crystal oscillator 58 generates a reference signal 70 at a first frequency. The reference signal 70 is passed to the reference divider 60 and divided to make a divided reference signal 72, which is passed to the phase comparator 62. The phase comparator 62 also receives a divided feedback signal 74 from the feedback divider 66. The phase comparator 62 uses the divided reference signal 72 and the divided feedback signal 74 to generate an error signal 76 which is filtered in filter 64 and used to control the controllable oscillator 68. If the state machine 68A is present, the state machine 68A may receive the error signal 76 and translate the error signal into a "state" of the state machine 68A and in turn controls the controllable oscillator 68. The controllable oscillator 68 generates an output signal 78, which is used within the mobile terminal 10 as needed and also fed back into the feedback divider 66. It should be appreciated that the control system 28 controls feedback divider 66 and/or reference divider 60 as needed.

The present invention lies in the controllable oscillator 68. Specifically, the error signal 76 is operated upon by the state machine 68A to turn the error signal 76 into one or more digital words which affect the operation of components within the controllable oscillator 68 such that the frequency of output signal 78 is controlled. Specifically, the components control parameters associated with the controllable oscillator 68 such that the frequency of the output signal 78 is controlled. While the present invention contemplates controlling parameters including capacitance, bias current, bias voltage, and supply voltage, the following examples are presented for better understanding of the present invention.

Figure 4:
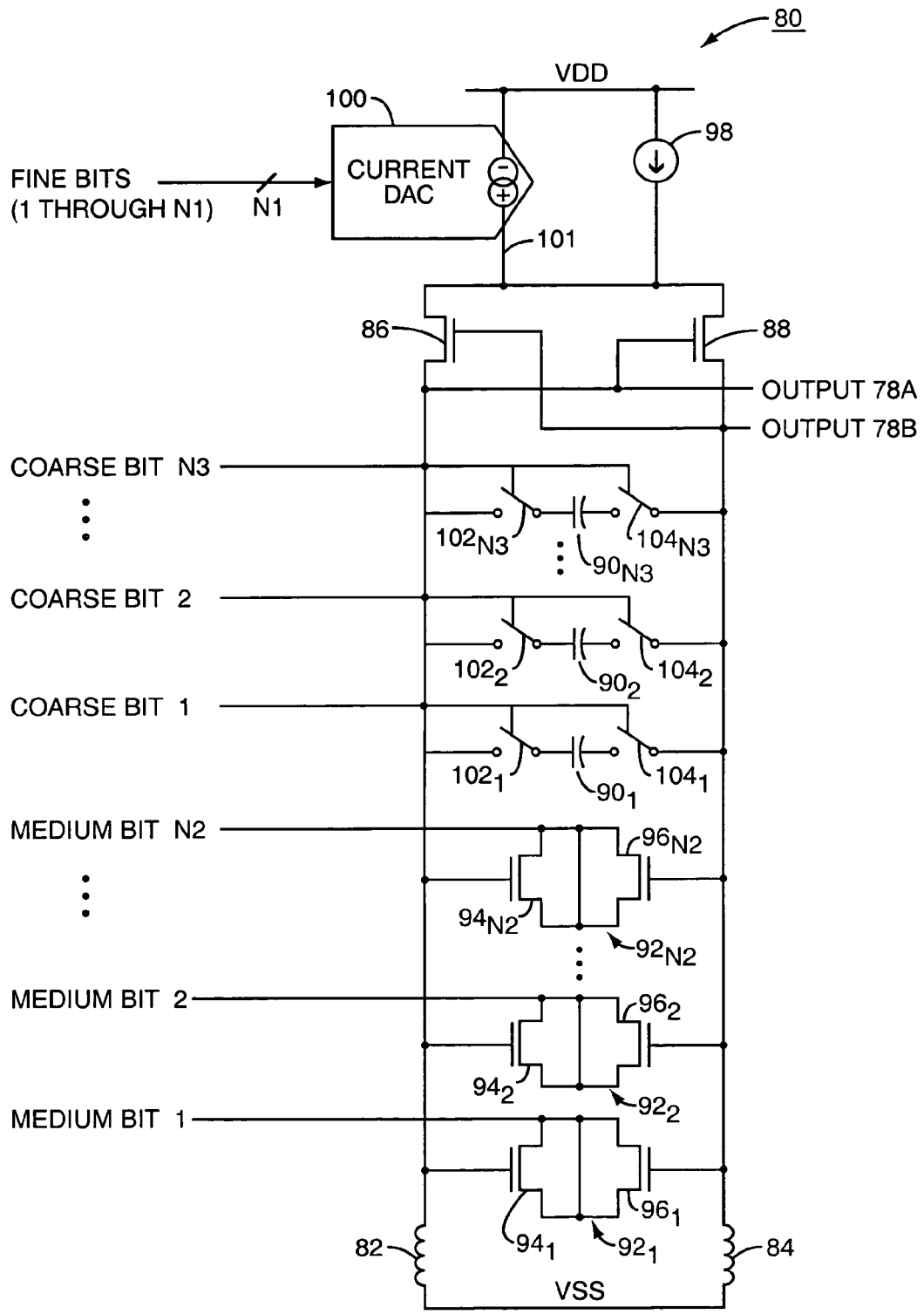
FIG. 4 illustrates a first exemplary embodiment of a digitally controlled LC oscillator according to the present invention.

An exemplary embodiment of a digitally controlled oscillator 80 is illustrated in FIG. 4. The digitally controlled oscillator 80 may be used in place of controllable oscillator 68 described above. Digitally controlled oscillator 80 is an LC oscillator whose output frequency is determined by the resonant frequency of the inductive (L) and capacitive (C) components of the circuit. The output frequency of digitally controlled oscillator 80 is determined primarily by first and second inductors 82, 84 and the capacitance of active PMOS transistors 86, 88. Additional capacitance is provided by coarse tuning capacitors $90_1$ through $90_{N3}$ and the capacitance of medium tuning MOS varactor banks $92_1$ through $92_{N2}$. Varactor banks 92 are formed from two varactors 94 and 96 (denoted by an appropriate subscript reflecting which bank they help form in FIG. 4). A current source 98 provides a bias current for the elements of the digitally controlled oscillator 80. The current source 98 is powered by voltage source VDD, and provides a fixed current that sets the operating point of the elements of digitally controlled oscillator 80. Voltage source VDD also supplies power to a current digital to analog converter (DAC) 100. Current DAC 100 creates a variable current signal 101, which couples with the current provided by the current source 98 to form a variable bias current for the elements of digitally controlled oscillator 80. It should be appreciated that the full scale current of the current DAC 100 is a small percentage of the fixed bias current of current source 98 so as not to affect the operating point.

The digitally controlled oscillator 80 generates an output signal 78 as previously discussed, or may generate a positive output 78A and a negative output 78B if needed (and as illustrated in FIG. 4). The output 78 (or 78A, 78B) is taken from the PMOS transistors 86 and 88 as illustrated.

In operation, the coarse tuning capacitors $90_1$ through $90_{N3}$ receive a first digital word of length N3. That is, the first digital word has N3 bits. The digital word comes from the optional state machine 68A, which derived the digital word from the error signal 76. Alternatively, if the optional state machine 68A is not present, the digital word may be derived from the control system 28 or the like as needed or desired. Coupled to each capacitor $90_1$ through $90_{N3}$ are switches 102 and 104 (denoted by subscripts as to which capacitor 90 to which they correspond). Each bit of the first digital word is used to turn on or off a corresponding set of switches 102, 104. That is, the first bit of the first digital word turns on or off switches $102_1$ and $104_1$ and the last bit of the first digital word turns on or off switches $102_{N3}$ and $104_{N3}$. In an exemplary embodiment, if the bit is a zero, then the corresponding switches 102, 104 are open, and if the bit is a one, then corresponding switches 102, 104 are closed. Thus, as the first digital word changes, different capacitors are switched in and out of the digitally controlled oscillator 80 and the frequency output changes. It should be appreciated that the values of the capacitors $90_1$ through $90_{N3}$ may be identical or varied as needed or desired. Because the value of each capacitor 90 is known, the value of the added capacitance for any given digital word may be calculated. Since the value of the added capacitance for any given digital word is known, or can be calculated, the change in C of the LC of the digitally controlled oscillator 80 may likewise be calculated.

In further operation, the medium tuning varactor banks $92_1$ through $92_{N2}$ receive a second digital word of length N2. That is, the second digital word has N2 bits. The second digital word preferably comes from the same source as the first digital word (e.g., the optional state machine 68A). Each bit of the second digital word is used to control a corresponding varactor bank 92. That is, the first bit of the second digital word turns to high or low capacitance state varactor bank $92_1$, and the last bit of the second digital word turns to high or low capacitance state varactor bank $92_{N2}$. It should be appreciated that the second digital word need not be of the same length as the first digital word, but it can be if desired. As the second digital word changes value, different varactor banks 92 will be turned on or off, impacting the value of the capacitance for the C portion of the LC of the digitally controlled oscillator 80, and the frequency output changes.

In still further operation, the fine tuning current DAC 100 receives a third digital word which sets the amount of current that flows through the current DAC 100. The third digital word has N1 digital bits. The third digital word preferably comes from the same source as the first digital word (e.g., the optional state machine 68A). It should be appreciated that N1 does not have to equal N2 or N3. However, N1 may be equal to N2 or N3 if desired.

Prior to use, a calibration routine is run so that the general outputs generated by the range of at least the first digital word are known. That is, a look up table or the like may be generated for each possible first digital word along with an output frequency for each such first digital word. This look up table may then be referenced by the control system 28 in the future. Specifically, if the control system 28 needs a frequency of a particular value, the control system 28 uses the look up table to determine what first digital word provides the frequency closest to the particular value. While it is contemplated that this calibration is done only for the first digital word, it is possible to do this for all possible combinations of the first and second digital words. Such an arrangement provides higher resolution of the lookup table, albeit at the expense of greater memory requirements. Further, this could be extended to more than two digital words if needed or desired. While it is possible to extend this all the way through the fine tuning digital word (e.g., the third digital word in the embodiment of FIG. 4), this is not preferred.

Figure 5A:
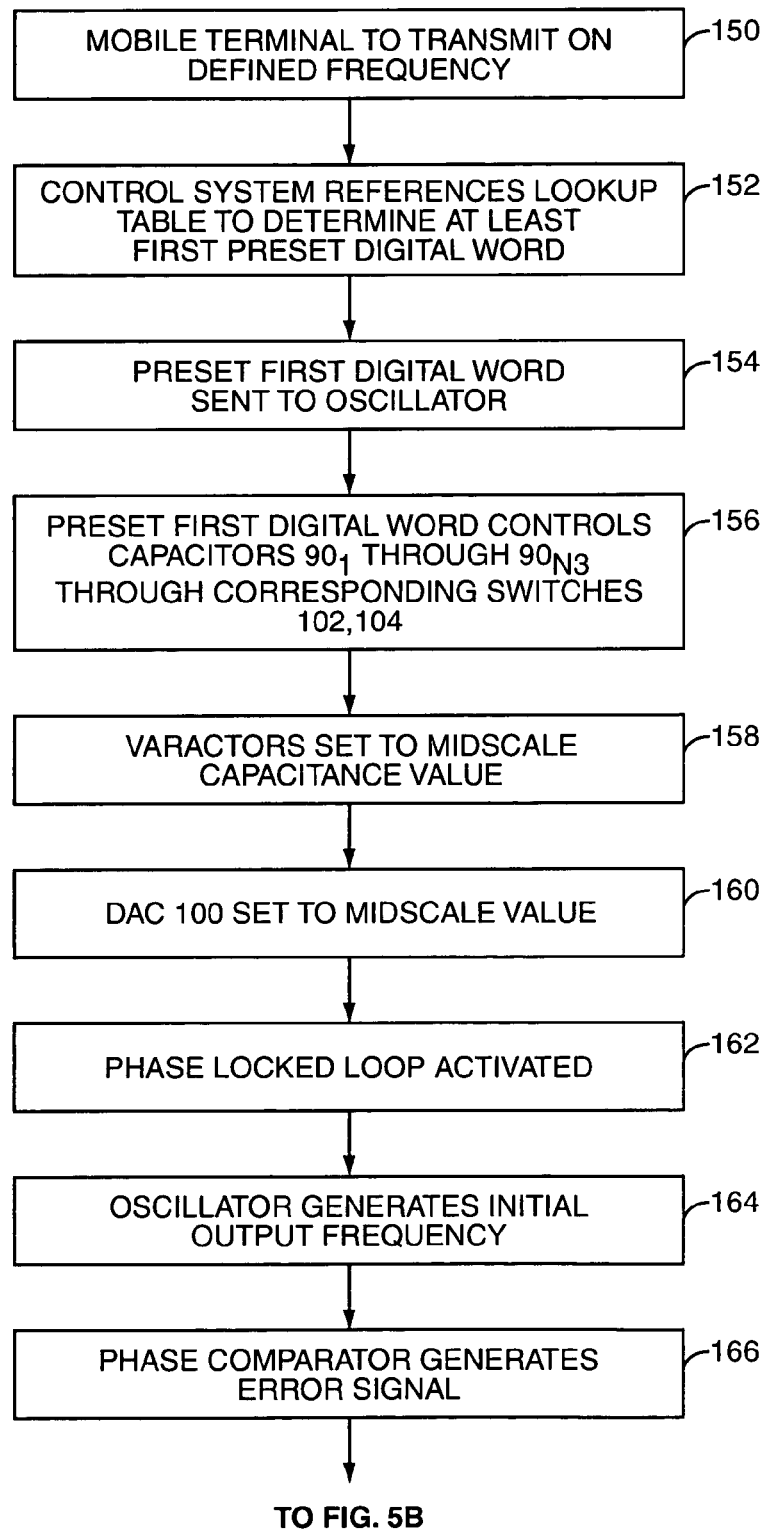
FIGS. 5A & 5B illustrate via a flow chart the method of using the oscillator of FIG. 4.
Figure 5B:
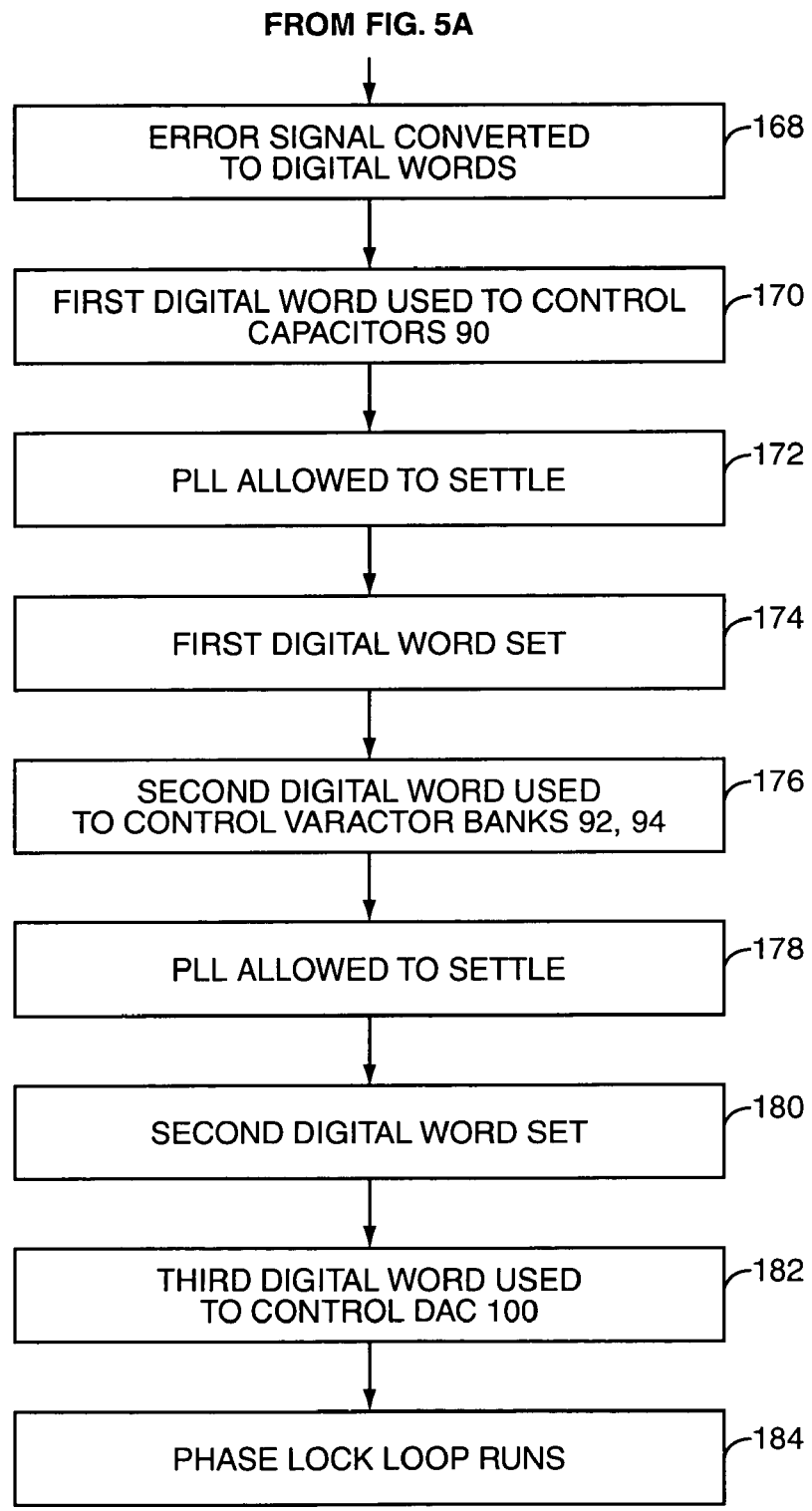

A flow chart of the use of the digitally controlled oscillator 80 is illustrated in FIGS. 5A & 5B. For the sake of example, the mobile terminal 10 needs to transmit a signal to a base station 14 on a defined frequency (block 150). The mobile terminal 10 has a priori knowledge of a frequency on which this transmission needs to occur such that the base station 14 will receive and process the transmission. This a priori knowledge may come from a communications standard, an earlier transmission from the base station 14, or other technique as is well understood in the telecommunications industry.

The control system 28 may reference the look up table generated during calibration and determine, based on the desired frequency, at least a preset first digital word (block 152). The preset first digital word is supplied to the digitally controlled oscillator 80 (block 154). The oscillator 80 uses the preset first digital word (also sometimes referred to herein as the coarse tuning word) to connect or disconnect the capacitors $90_1$ through $90_{N3}$ from the circuit. Conceptually, this may be thought of as turning the capacitors $90_1$ through $90_{N3}$ on or off (block 156). That is, as described above, the bits of the first digital word control whether a corresponding capacitor 90 is connected to the inductors 82, 84 by way of the corresponding switches 102, 104. The oscillator 80 also sets the second digital word to a midscale value such that a midscale capacitance value is effectuated by the varactor banks 92, 94 (block 158).

In an alternate embodiment, rather than use a look up table, the first digital word may be set to a midscale value and supplied to the digitally controlled oscillator 80. In practice, the digitally controlled oscillator 80 tunes relatively quickly and such a midscale value will work for many embodiments. As another embodiment, the look up table could be created based on a previously used value. For example, in a Bluetooth device that frequency hops around the same frequency, the values in the look up table could have been empirically determined based on the last time that the device was on the desired frequency. Other variations of deriving the coarse tuning word are also possible.

The current DAC 100 is set to a midscale value (block 160) and the phase locked loop 56, using the digitally controlled oscillator 80, is activated (block 162). The digitally controlled oscillator 80 oscillates at the initial output frequency, thereby generating the initial output frequency in output signal 78 (block 164). Frequency error between the desired and actual output frequencies is measured by the phase comparator 62 and an error signal 76 is generated (block 166). The error signal 76 acts on the state machine 68A. The state machine 68A translates the error signal 76 into at least one digital word (block 168) and preferably three digital words. The digital word derived from the error signal 76 replaces the preset first digital word and is used to control the switches 102, 104 to change the capacitance of the digitally controlled oscillator 80. The state machine 68A presents the first digital word to the digitally controlled oscillator 80 and connects and disconnects the corresponding capacitors $90_1$ through $90_{N3}$ from the circuit (block 170). Meanwhile, the second and third digital words remain set to midscale holding values by the state machine 68A, and the varactor banks 92, 94, and the current DAC 100 operate without variation.

The phase locked loop 56 is allowed to settle (block 172). Specifically, the phase locked loop 56 evaluates the output signal 78 and generates the error signal 76. As the phase locked loop 56 settles, the error signal 76 diminishes, and the changes to the first digital word also diminish. This reflects the coarse tuning of the frequency synthesizer 30. This takes approximately one microsecond in an exemplary embodiment. This settling time may be determined by a timer (not shown) within the state machine 68A, or alternatively, may be determined by a lack of change in the first digital word, or other comparable scheme. Once the phase locked loop 56 has settled, the first digital word is set in memory of the state machine 68A (block 174).

The state machine 68A derives the second digital word from the error signal 76 and the second digital word replaces the midscale holding value previously used. Specifically, the second digital word is used to control the varactor banks 92, 94 (block 176). Again, the phase locked loop 56 is allowed to settle (block 178). This settling takes approximately one microsecond in an exemplary embodiment and may be determined through any desired mechanism. Once the phase locked loop 56 has settled a second time, the second digital word is set in memory of the state machine 68A (block 180). This represents the medium tuning of the frequency synthesizer 30.

The state machine 68A then derives the third digital word from the error signal 76, and the third digital word replaces the midscale holding value previously used. Specifically, the third digital word is used to control the current DAC 100 (block 182). At this point, the phase locked loop 56 is allowed to run with any drift or jitter in the frequency being corrected by the error signal 76 (block 184). The changes to the current produced by the current DAC 100 represent the fine tuning of the frequency synthesizer 30. This process will run until the mobile terminal 10 no longer needs the selected frequency, at which point the digital words stored in memory are cleared and the process starts over as needed.

The description of FIGS. 5A & 5B assumes that the optional state machine 68A is used to provide the digital words to the digitally controlled oscillator 80. While this is a preferred embodiment, other embodiments could provide the digital words from another source such as the control system 28 or the baseband processor 26. It should further be appreciated that the tuning achieved by the various techniques preferably has at least one least significant bit (LSB) overlap between the different techniques. This insures that the various tuning levels represent a continuum and there are no breaks in the ability to tune to a particular frequency. Also note that while FIGS. 5A and 5B contemplate the frequency synthesizer 30 being used to generate a carrier frequency for a transmission, frequency synthesizer 30 goes through a very similar process for downconversion of received signals. Note further that while the preferred embodiment uses three tuning techniques (coarse, medium, and fine), alternate embodiments might use two tuning techniques. Likewise, it is possible that tuning may be effected with only one tuning technique.

Figure 6:
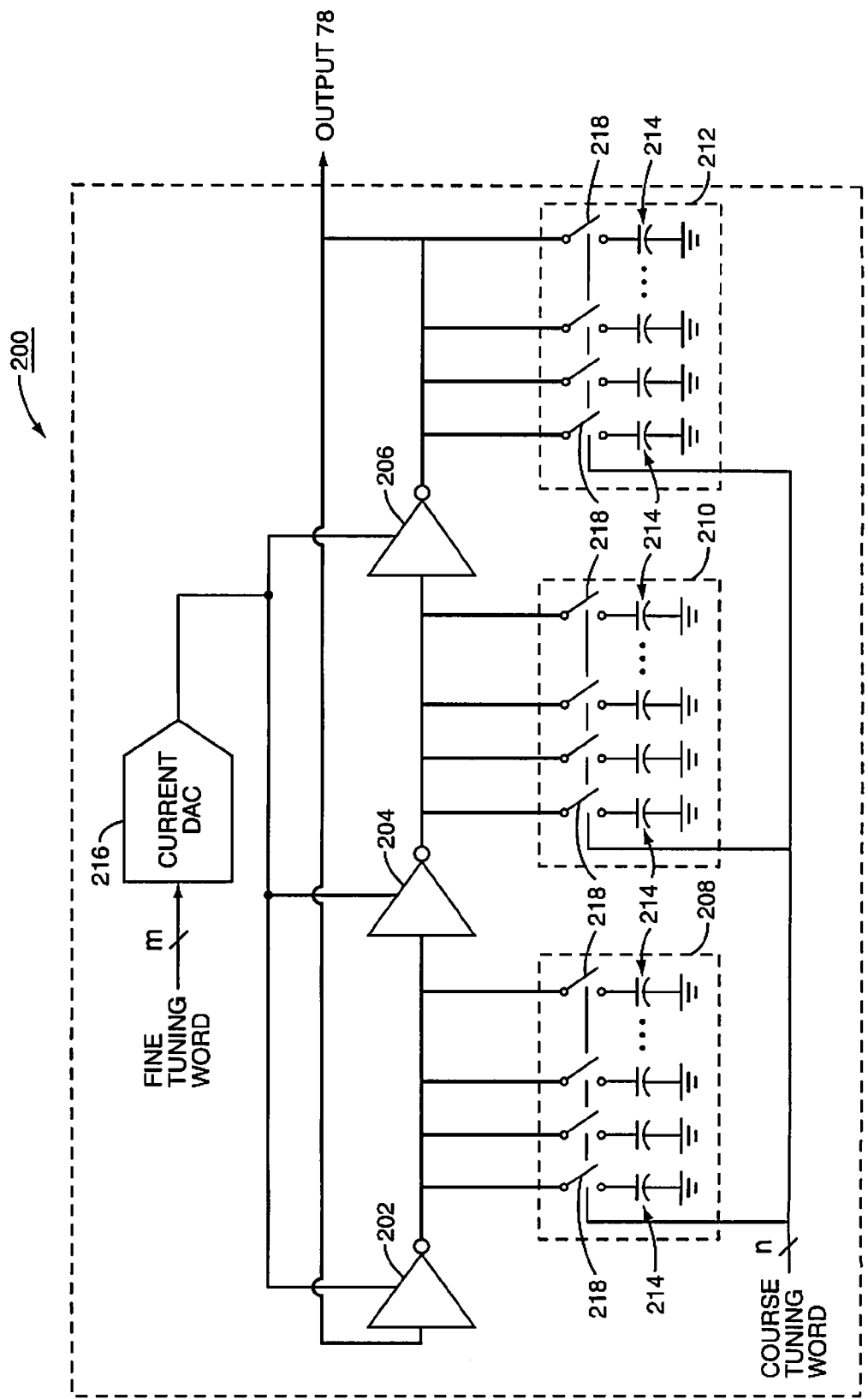
FIG. 6 illustrates a second exemplary embodiment of a digitally controlled ring oscillator according to the present invention.

While FIGS. 4, 5A, and 5B show one exemplary oscillator, a ring oscillator 200 made from CMOS inverters 202, 204, 206 could also be used as illustrated in FIG. 6. It should be appreciated that this ring oscillator 200 is also a digitally controlled oscillator with an output 78, albeit with a structure different than that of the digitally controlled oscillator 80.

Each inverter 202, 204, 206 is loaded with a bank of capacitors 208, 210, 212 respectively. Each bank of capacitors has N capacitors 214. Furthermore, a current DAC 216 is used to set the bias current to the inverters 202, 204, 206.

The N capacitors 214 may be n binary weighted capacitors or identical capacitors as needed or desired. A thermometer decoder (not shown) may be used to convert an n-bit word where the bits are binary weighted to a $(2^n)-1$ bit word where the bits are equally weighted. Typically in a thermometer decoder, once an input value is great enough to turn an output bit on, the output bit remains on for all greater input values (similar to the column of mercury in a thermometer—hence the name). This technique is used in DACs where monotonicity must be guaranteed. It should be appreciated that the capacitors 214 form the coarse tuning and the current DAC 216 controls the fine tuning of the present embodiment. Whereas the banks of capacitors 208, 210, 212 receive a first digital word with N bits, the current DAC 216 receives a second digital word with M bits. N does not have to equal M, although it may. The first digital word turns on and off switches 218. There is a switch 218 for each capacitor 214.

The ring oscillator 200 may also be subjected to a calibration routine to determine initial digital word sets that can be used to approximate a desired frequency output from the frequency synthesizer 30. This calibration of first digital words may be placed in memory in a lookup table or the like as needed or desired.

Figure 7A:
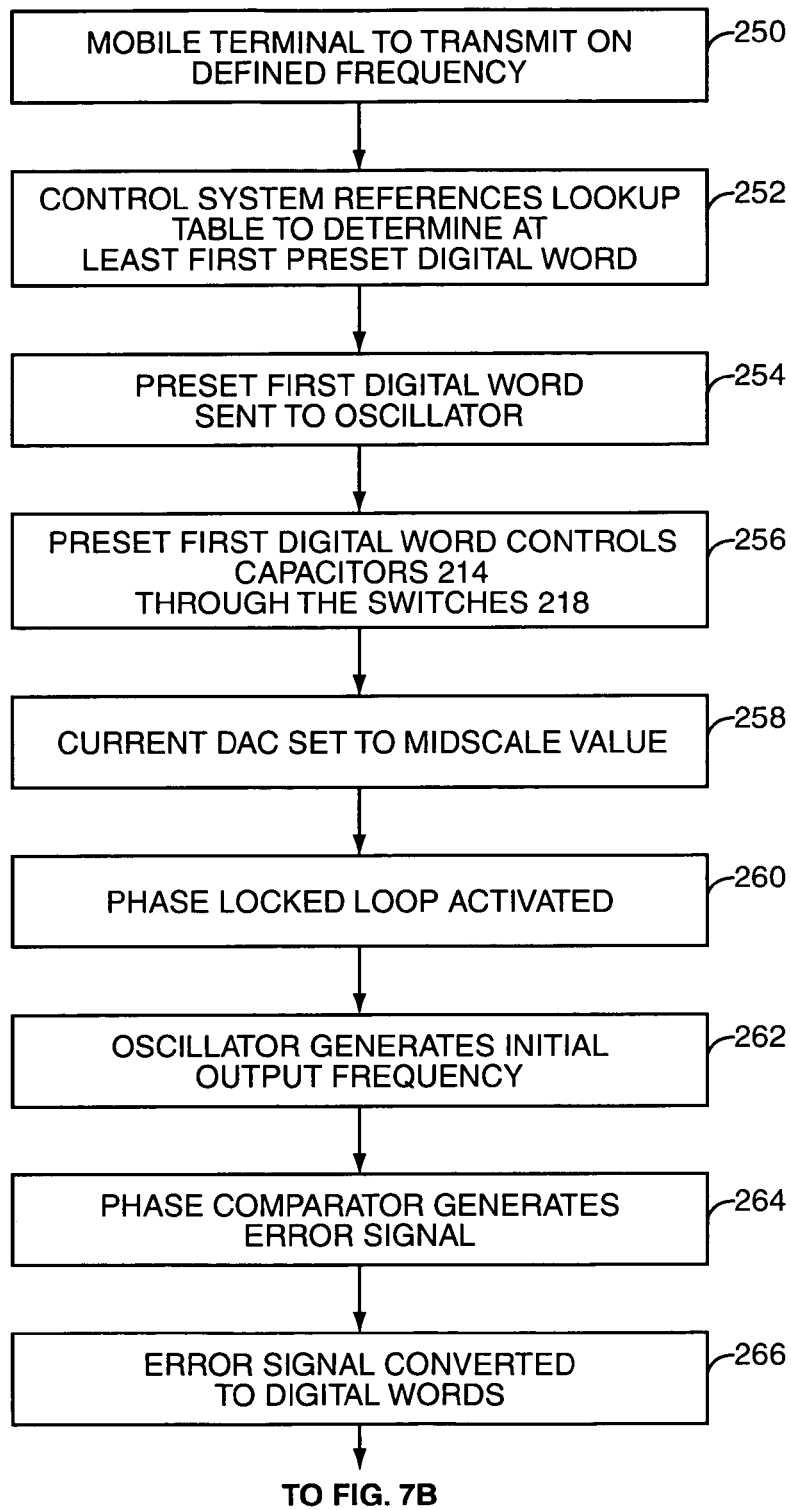
FIGS. 7A & 7B illustrate via a flow chart the method of using the oscillator of FIG. 6.
Figure 7B:
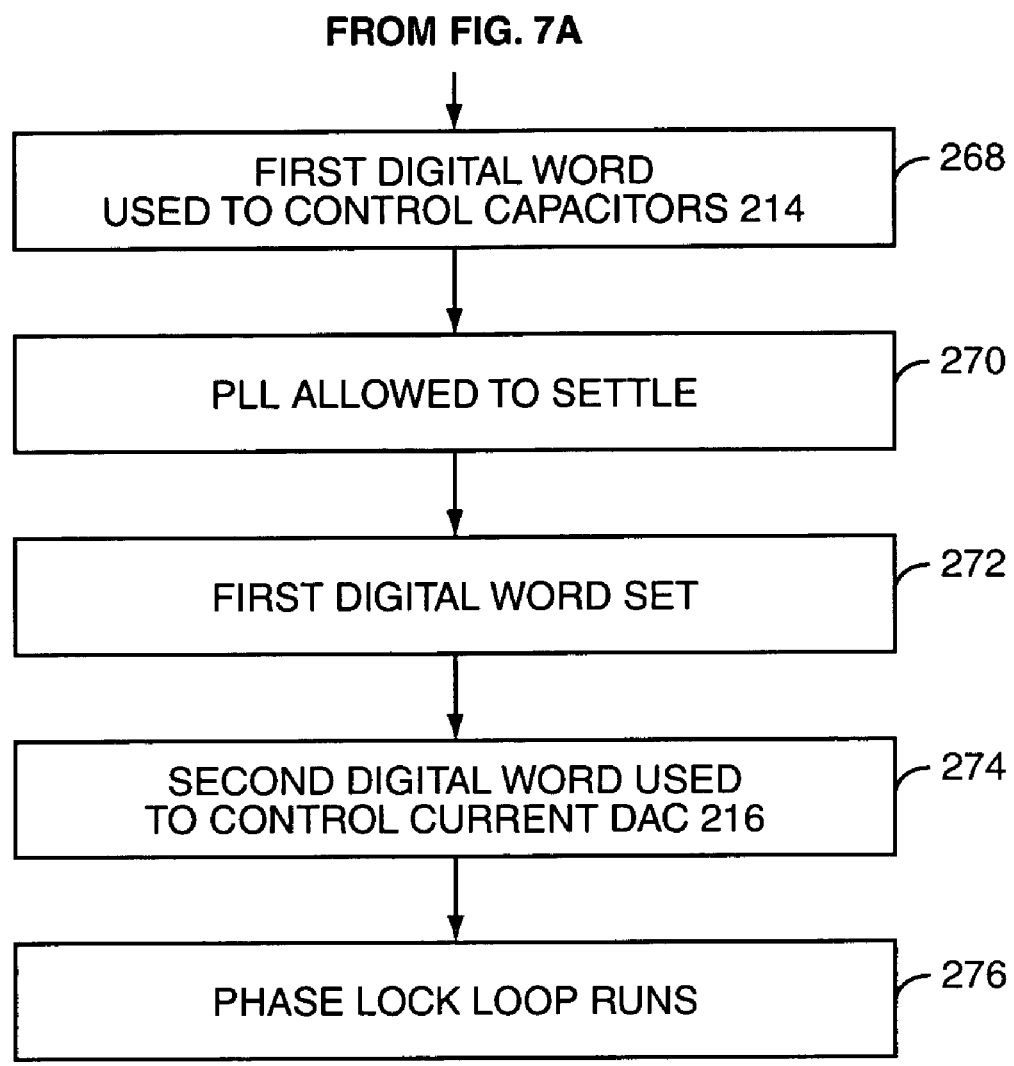

The method of use of the ring oscillator 200 is presented in a flow chart in FIG. 7. For the sake of example, the mobile terminal 10 needs to transmit a signal to a base station 14 on a defined frequency (block 250). The mobile terminal 10 has a priori knowledge of a frequency on which this transmission needs to occur such that the base station 14 will receive and process the transmission. This a priori knowledge may come from a communications standard, an earlier transmission from the base station 14, or other technique as is well understood in the telecommunications industry.

The control system 28 will reference the look up table generated during calibration and determine, based on the desired frequency, at least the preset first digital word (block 252). The preset first digital word is supplied to the ring oscillator 200 (block 254). The ring oscillator 200 uses the preset first digital word (also sometimes referred to herein as the coarse tuning word) to open and close the corresponding switches 218 (block 256) effectively adding or taking out of the circuit the corresponding capacitors 214. The state machine 68A also sets the second digital word to a midscale holding value such that a midrange value current is produced by the current DAC 216 (block 258).

Again note that the preset first digital word may be derived from a look up table, set to a midscale value, derived from previous empirical data, or the like as needed or desired.

The phase locked loop 56, using the ring oscillator 200, is activated (block 260). The ring oscillator 200 oscillates at the initial output frequency to generate the initial output frequency (block 262). Frequency error between the desired and actual output frequencies is measured by the phase comparator 62, and an error signal 76 is generated (block 264). The error signal 76 acts on the state machine 68A. The state machine 68A translates the error signal 76 into at least one digital word (block 266) and preferably two digital words. The first digital word replaces that generated by the look up table (i.e., the preset first digital word) and is used to control the switches 218. The state machine 68A presents the first digital word to the ring oscillator 200 and connects and disconnects the corresponding capacitors 214 from the circuit. Note that connecting and disconnecting may conceptually be viewed as turning the capacitors 214 on and off (block 268). Meanwhile, the second digital word remains set to the midscale holding value by the state machine 68A and the current DAC 216 operates without variation.

The phase locked loop 56 is allowed to settle (block 270). Specifically, the phase locked loop 56 evaluates the output signal 78 and generates the error signal 76. As the phase locked loop 56 settles, the error signal 76 diminishes, and the changes to the first digital word also diminish. This reflects the coarse tuning of the frequency synthesizer 30. This takes approximately one nanosecond in an exemplary embodiment. This settling time may be determined by a timer (not shown) within the state machine 68A, or alternatively, may be determined by a lack of change in the first digital word, or other comparable scheme. Once the phase locked loop 56 has settled, the first digital word is set in the memory of the state machine 68A (block 272).

The state machine 68A derives the second digital word from the error signal 76, and the second digital word replaces the midscale holding value previously used. Specifically, the second digital word is used to control the current DAC 216 (block 274). At this point, the phase locked loop 56 is allowed to run with any drift or jitter in the frequency being corrected by the error signal 76 (block 276). The changes to the current produced by the current DAC 216 represent the fine tuning of the frequency synthesizer 30. This process will run until the mobile terminal 10 no longer needs the selected frequency, at which point the digital words stored in memory are cleared and the process starts over as needed.

As will be readily appreciated, other controllable oscillators may be adapted to the present invention. Likewise, while the examples presented herein focus on changing capacitance and bias currents, other parameters may also be varied to achieve tuning for the oscillators. For example, the supply voltage or bias voltage may be varied by an appropriate component such that the output frequency of the controllable oscillator. Other parameters may also be varied if needed or desired.

Those skilled in the art will recognize improvements and modifications to the preferred embodiments of the present invention. All such improvements and modifications are considered within the scope of the concepts disclosed herein and the claims that follow.

What is claimed is:

1. A digitally controlled oscillator comprising:
   a first controllable component controlling a first parameter affecting an output frequency of the digitally controlled oscillator, wherein:
   said first controllable component comprises a bank of capacitors;
   said first parameter comprises capacitance; and
   said first controllable component is adapted to be controlled by a first digital word to effectuate coarse tuning of the digitally controlled oscillator;
   a current digital to analog converter (CDAC) controlling a second parameter affecting the output frequency of the digitally controlled oscillator, wherein said CDAC is adapted to be controlled by a second digital word to effectuate fine tuning of the digitally controlled oscillator and the second parameter includes a variable bias current provided to the first controllable component; and
   a third controllable component controlling a third parameter affecting the output frequency of the digitally controlled oscillator, wherein:
   said third controllable component comprises a bank of varactors;
   said third parameter comprises capacitance; and
   said third controllable component is adapted to be controlled by a third digital word to effectuate an intermediate level of tuning of the digitally controlled oscillator.

2. The digitally controlled oscillator of claim 1 wherein said digitally controlled oscillator comprises a ring oscillator.

3. The digitally controlled oscillator of claim 1 further comprising a control element adapted to generate said first, second and third digital words.

4. A method of controlling an oscillator comprising:
   generating a first tuning digital word;
   presenting the first tuning digital word to said oscillator;
   controlling a first controllable element comprising a bank of capacitors to control a coarse tuning of capacitance provided to the oscillator with said first tuning digital word, thereby coarse tuning the oscillator;
   generating a second tuning digital word;

presenting the second tuning digital word to the oscillator;

controlling a current digital to analog converter (CDAC) associated with the oscillator with said second tuning digital word to control a fine tuning of a variable bias current to the first controllable element, thereby fine tuning the oscillator;

generating a third tuning digital word;

presenting the third tuning digital word to the oscillator; and controlling a bank of varactors to control an intermediate tuning of capacitance provided to the oscillator with said third tuning digital word, thereby providing an intermediate tuning of the oscillator.

5. The method of claim 4 wherein presenting the first tuning digital word to an oscillator comprises presenting the first tuning digital word to a ring oscillator.

6. The digitally controlled oscillator of claim 1 further comprising circuitry adapted to provide the first, second, and third digital words based on an analog control signal.

7. The digitally controlled oscillator of claim 6 wherein the digitally controlled oscillator is included within a phase-locked loop having a loop filter and the analog control signal is provided by the loop filter.

8. The method of claim 4 further comprising providing the first, second, and third digital words based on an analog control signal.

9. The method of claim 8 wherein the digitally controlled oscillator is included within a phase-locked loop having a loop filter, and further comprising providing the analog control signal from an output of the loop filter.

10. A digitally controlled oscillator comprising:

a bank of capacitors adapted to control a coarse tuning capacitance affecting an output frequency of a digitally controlled oscillator, wherein said bank of capacitors is adapted to be controlled by a first digital word to effectuate the coarse tuning capacitance of the digitally controlled oscillator;

a bank of varactors adapted to control an intermediate tuning capacitance affecting the output frequency of the digitally controlled oscillator, wherein said bank of varactors is adapted to be controlled by a second digital word to effectuate the intermediate tuning capacitance of the digitally controlled oscillator; and a current digital to analog converter (CDAC) adapted to control a fine tuning bias current affecting the output frequency of the digitally controlled oscillator, wherein said CDAC is adapted to be controlled by a third digital word to effectuate the fine tuning bias current of the digitally controlled oscillator by providing the fine tuning bias current to the bank of capacitors and the bank of varactors.

11. A method of controlling an oscillator comprising:

presenting a bank of capacitors with a first digital word to set a coarse tuning capacitance of a digitally controlled oscillator;

measuring a first error in an output frequency of the digitally controlled oscillator;

determining a first correction for the output frequency;

presenting a bank of varactors with a second digital word based upon the first correction to set an intermediate tuning capacitance of the digitally controlled oscillator;

measuring a second error in the output frequency of the digitally controlled oscillator;

determining a second correction for the output frequency;

presenting a current digital to analog converter (CDAC) with a third digital word based upon the second correction to set a fine tuning bias current of the digitally controlled oscillator; and providing the fine tuning bias current to the bank of capacitors and the bank of varactors.

\* \* \* \* \*